(12) United States Patent
Rose et al.

(10) Patent No.: US 9,923,576 B2
(45) Date of Patent: Mar. 20, 2018

(54) DECODING TECHNIQUES USING A PROGRAMMABLE PRIORITY ENCODER

(71) Applicant: Cisco Technology, Inc., San Jose, CA (US)

(72) Inventors: Kenneth Michael Rose, San Carlos, CA (US); Jason Allen Marishaw, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 31 days.

(21) Appl. No.: 14/487,475

(22) Filed: Sep. 16, 2014

(65) Prior Publication Data

US 2016/0077957 A1    Mar. 17, 2016

(51) Int. Cl.
| | |
|---|---|
| *H03M 7/42* | (2006.01) |
| *H04N 19/91* | (2014.01) |
| *H04N 19/463* | (2014.01) |
| *G06F 12/02* | (2006.01) |
| *H04L 1/00* | (2006.01) |
| *H03M 7/30* | (2006.01) |
| *G06F 3/06* | (2006.01) |
| *G11C 7/10* | (2006.01) |

(52) U.S. Cl.
CPC .......... *H03M 7/42* (2013.01); *H03M 7/6011* (2013.01); *G06F 3/0619* (2013.01); *G06F 12/0238* (2013.01); *G11C 7/1006* (2013.01); *G11C 2207/102* (2013.01); *H03M 7/30* (2013.01); *H04L 1/0045* (2013.01); *H04L 2209/34* (2013.01); *H04N 19/463* (2014.11); *H04N 19/91* (2014.11)

(58) Field of Classification Search
CPC .... H04N 19/91; H04N 19/463; G06F 3/0619; G06F 12/0238; H04L 1/0045; H04L 2209/34; H03M 7/30; H03M 7/42; H03M 7/6011; G11C 7/1006; G11C 2207/102
USPC ...................................... 375/240.24; 714/765
See application file for complete search history.

(56) References Cited

U.S. PATENT DOCUMENTS

| | | | | |
|---|---|---|---|---|
| 5,313,469 A | * | 5/1994 | Adham .......... | G01R 31/318321 708/444 |
| 5,398,027 A | * | 3/1995 | Ooi ....................... | H03M 7/425 341/106 |
| 5,528,628 A | * | 6/1996 | Park ...................... | H03M 7/42 375/240 |

(Continued)

OTHER PUBLICATIONS

RFC 1951, Deflate Compressed Data Format Specification version 1.3 dated May 1996.

(Continued)

*Primary Examiner* — April Y Blair
*Assistant Examiner* — Sazzad Hossain
(74) *Attorney, Agent, or Firm* — Meunier Carlin & Curfman LLC

(57) ABSTRACT

A system, computer-readable media, and methods are disclosed for building a decoding table. The system may include one or more registers configured to store a data value based on an order in which one or more lengths were obtained. The system may also include a programmable priority encoder configured to scan the one or more registers for the data value. Further, the system may include a memory configured to store, based on locations of the data value in the one or more registers, at least one of encoding values or letters.

20 Claims, 8 Drawing Sheets

(56) References Cited

U.S. PATENT DOCUMENTS

| | | | | |
|---|---|---|---|---|
| 5,539,401 | A * | 7/1996 | Kumaki | G06T 9/005 341/106 |
| 5,625,355 | A * | 4/1997 | Takeno | H03M 7/425 341/106 |
| 6,526,421 | B1 * | 2/2003 | Houldsworth | G06F 8/445 |
| 6,621,429 | B2 | 9/2003 | Tsuchido et al. | |
| 7,099,426 | B1 * | 8/2006 | Cory | H04L 7/005 375/372 |
| 7,283,591 | B2 | 10/2007 | Ruehle et al. | |
| 7,538,696 | B2 | 5/2009 | Laker et al. | |
| 7,764,205 | B2 | 7/2010 | Owsley et al. | |
| 8,466,711 | B2 | 6/2013 | Nebhrajani et al. | |
| 8,505,054 | B1 * | 8/2013 | Kirley | H04N 21/4307 725/74 |
| 8,593,308 | B1 | 11/2013 | Biran et al. | |
| 2003/0006918 | A1 * | 1/2003 | Barnett | H03M 7/425 341/67 |
| 2009/0058694 | A1 * | 3/2009 | Owsley | H03M 7/40 341/65 |
| 2011/0185077 | A1 * | 7/2011 | Bremler-Barr | H03M 7/3086 709/231 |
| 2013/0249716 | A1 * | 9/2013 | Carlson | H03M 7/3084 341/51 |
| 2015/0188563 | A1 * | 7/2015 | Dickie | H03M 7/6005 708/203 |

OTHER PUBLICATIONS

Davies, Command Line Fanatic, Dissecting the GZIP format dated Apr. 24, 2011, pp. 1-21.

Rash, Unzipping the GZIP Compression Protocol, chipestimate. com, Mar. 23, 2010.

Ouyang, System Group, Baidu Inc., FPGA Implementation of GZIP Compression and Decompression for IDC Services, 2010.

\* cited by examiner

FIG. 4A

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 | 0 |
| 4 | 1 | 0 | 0 | 0 | 0 | 0 | 0 | 0 | 0 | 0 | 0 | 0 | 0 | 0 | 0 | 0 |
| 5 | 0 | 0 | 0 | 0 | 0 | 0 | 0 | 0 | 0 | 0 | 0 | 0 | 0 | 0 | 0 | 0 |
| 6 | 0 | 0 | 0 | 0 | 0 | 0 | 0 | 0 | 0 | 0 | 0 | 0 | 0 | 0 | 0 | 0 |
| 7 | 0 | 0 | 0 | 0 | 0 | 0 | 0 | 0 | 0 | 0 | 0 | 0 | 0 | 0 | 0 | 0 |

FIG. 4B

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 |
| 2 | 0 | 0 | 1 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 | 0 |
| 4 | 1 | 0 | 0 | 0 | 0 | 0 | 0 | 0 | 0 | 0 | 0 | 0 | 0 | 0 | 0 | 0 |
| 5 | 0 | 0 | 0 | 0 | 0 | 0 | 0 | 0 | 0 | 0 | 0 | 0 | 0 | 0 | 0 | 0 |
| 6 | 0 | 0 | 0 | 0 | 0 | 0 | 0 | 0 | 0 | 0 | 0 | 0 | 0 | 0 | 0 | 0 |
| 7 | 0 | 0 | 0 | 0 | 0 | 0 | 0 | 0 | 0 | 0 | 0 | 0 | 0 | 0 | 0 | 0 |

DECODING TECHNIQUES USING A PROGRAMMABLE PRIORITY ENCODER

TECHNICAL FIELD

The present disclosure relates generally to creating a decoding table using a programmable priority encoder.

BACKGROUND

The amount of data being stored and transmitted over networks continues to increase. Data streams are often encoded to reduce the amount of required memory. One example of data compression involves identifying patterns of symbols, such as letters, that are transmitted frequently. Instead of retransmitting the same patterns of symbols, the pattern may be transmitted once. When that same pattern is identified again, a reference to the previous pattern may be transmitted instead of repeating the pattern. Because the reference, or pointer, to the previous pattern is shorter than retransmitting the pattern itself, the data stream can be compressed.

One example of a type of data compression is the GZIP format, which is used to store system images for routers and switches, to transmit web pages, voice, audio, text, and other data, and in a variety of other applications. GZIP uses a sliding window protocol for rebuilding bytes of data and Huffman encoded commands that control operation of the sliding window protocol. One particular example of Huffman encoding is canonical Huffman encoding, which provides enhanced data compression.

Canonical Huffman encoding involves, generally, encoding a bit stream at a transmitter by creating a codebook that describes how the bit stream has been encoded. The encoded bit stream is transmitted to a receiver along with the codebook, and the receiver uses the codebook to recreate the bit stream from the encoded bit stream. In particular, canonical Huffman encoding uses bit lengths to represent characters in the codebook. By transmitting the lengths in a defined order, the receiver can recreate characters using the transmitted lengths.

The process of recreating a codebook by a receiver and decoding a bit stream from transmitted lengths requires time and processing resources. With increased transmission of encoded data, data recipients spend an increasing amount of their processing resources creating decoding tables and decoding bit streams into usable forms. Creating a decoding table using software, for example, requires additional processing time that can delay system responsiveness.

The present disclosure uses a programmable priority encoder to create a canonical Huffman decoding table in a ternary content-addressable memory and overcome one or more problems discussed above, among others.

BRIEF DESCRIPTION OF THE DRAWINGS

FIGS. 4A-C illustrate exemplary registers being programmed based on received lengths.

Like reference numbers and designations in the various drawings indicate like elements.

DESCRIPTION OF EXAMPLE EMBODIMENTS

Overview

In accordance with one aspect, the present disclosure is directed to a system including one or more registers configured to store a data value based on an order in which one or more lengths were obtained. The system may also include a programmable priority encoder configured to scan the one or more registers for the data value. Further, the system may include a memory configured to store, based on locations of the data value in the one or more registers, at least one of encoding values or letters.

In accordance with another aspect, the present disclosure relates to a method including receiving lengths associated with an encoding scheme. The method may also include programming a data value into one or more registers associated with the lengths based on the order in which the lengths were received. Further, the method may include scanning the one or more registers for the data value using a programmable priority encoder, and determining, based on locations of the data value in the one or more registers, at least one of encoding values or letters.

In accordance with another aspect, the present disclosure relates to one or more computer readable storage media encoded with software comprising computer executable instructions that, when executed, obtain lengths associated with an encoding scheme. The software may also program a data value into one or more registers associated with the lengths based on the order in which the lengths were obtained. Further, the software may scan the one or more registers for the data value using a programmable priority encoder. Finally, the software may determine, based on locations of the data value in the one or more registers, at least one of encoding values or letters.

Example Embodiments

Figure 1:
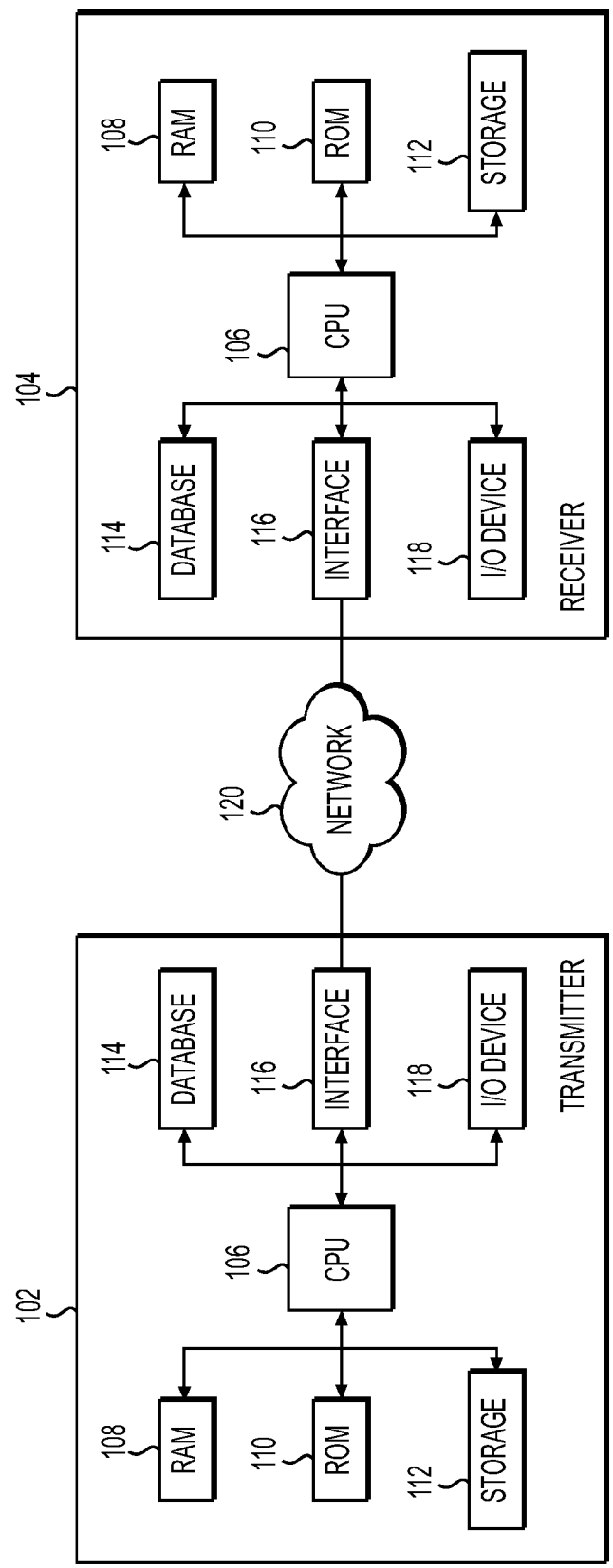
FIG. 1 is a system diagram of an example environment for transmitting and receiving encoded data.

FIG. 1 illustrates a system diagram of an example environment for transmitting and receiving encoded data. As illustrated, a transmitter 102 may be connected to a receiver 104 through, for example, network 120. The transmitter may encode data to be sent over network 120 to reduce the amount of data sent. The transmitter may also send information necessary to decode the data by receiver 104. Transmitter 102 and receiver 104 may be, for example, network routing equipment, such as a router or a switch, a computer, a handheld device such as a smart phone, a printer, or any other electronic device that stores data or sends data over network 120.

The data transmitted between transmitter 102 and receiver 104 may use any type of encoding and compression algorithm. One example includes Huffman encoding, and, more particularly, canonical Huffman encoding. Data may be encoded using multiple encoding schemes or encoded multiple times using the same encoding scheme. For example, data may be transmitted using GZIP compression along with canonical Huffman encoding. Examples of this type of data transmission can be found in RFC-1951 and RFC-1952.

While description will be provided below of transmitting an encoded bit stream from a transmitter 102 to receiver 104, the decoding techniques discussed herein may also be used within a single device. A device may store data in an encoded fashion to conserve memory usage. The device may decode data when it is read from memory. One example includes storing a system image for a router or switch in a compressed GZIP format. When the router or switch is turned on, it may be decompressed the image using the techniques described below to improve boot times.

Transmitter 102 and receiver 104 may, in one example, include substantially similar components. Transmitter 102 and receiver 104 may include one or more hardware components such as, a central processing unit (CPU) or microprocessor 106, a random access memory (RAM) module 108, a read-only memory (ROM) module 110, a memory or data storage module 112, a database 114, an interface 116, and one or more input/output (I/O) devices 118. Alternatively and/or additionally, transmitter 102 and receiver 104 may include one or more software media components such as, for example, a computer-readable medium including computer-executable instructions for performing methods consistent with certain disclosed embodiments. It is contemplated that one or more of the hardware components listed above may be implemented using software. For example, storage 112 may include a software partition associated with one or more other hardware components. While exemplary components have been described, devices implementing the decoding techniques may include additional, fewer, and/or different components than those listed above.

CPU 106 may include one or more processors, each configured to execute instructions and process data to perform one or more functions. CPU 106 may implement the disclosed decoding algorithms, or the algorithms may be implemented by interface 116, or a combination of the two. CPU 106 may be communicatively coupled to RAM 108, ROM 110, storage 112, database 114, interface 116, and I/O devices 118. CPU 106 may be configured to execute sequences of computer program instructions to perform various processes, which will be described in detail below. The computer program instructions may be loaded into RAM 108 for execution by CPU 106.

RAM 108 and ROM 110 may each include one or more devices for storing information associated with device operation. For example, ROM 110 may include a memory device configured to access and store information for encoding and decoding bit streams. RAM 108 may include a memory device for storing data associated with one or more operations of CPU 106 or interface 116. For example, ROM 110 may load instructions into RAM 108 for execution by CPU 106.

Storage 112 may include any type of mass storage device configured to store information that CPU 106 may need to perform processes consistent with the disclosed embodiments. For example, storage 112 may include one or more magnetic and/or optical disk devices, such as hard drives, CD-ROMs, DVD-ROMs, or any other type of mass media device. Alternatively or additionally, storage 112 may include flash memory mass media storage or other semiconductor-based storage medium. In one example, storage 112 may be ternary content-addressable memory (TCAM) to store and decode canonical Huffman codes, as discussed in more detail below. A traditional memory searches for an address and return the data value within a particular location. TCAM memory, however, operates by searching for a data value and returning an address at which the data value has been located.

Database 114 may include one or more software and/or hardware components that cooperate to store, organize, sort, filter, and/or arrange data. CPU 106 may access the information stored in database 114 to determine how a bit stream will be encoded and decoded. Database 114 may store additional and/or different information than that listed above.

Interface 116 may include one or more components configured to transmit and receive data via a communication network 120, which may be the Internet, a local area network, a workstation peer-to-peer network, a direct link network, a wireless network, or any other suitable communication platform. For example, interface 116 may include one or more modulators, demodulators, multiplexers, demultiplexers, network communication devices, wireless devices, antennas, modems, and any other type of device configured to enable data communication via a communication network. According to one embodiment, interface 116 may be coupled to or include wireless communication devices, such as a module or modules configured to transmit information wirelessly using Wi-Fi or Bluetooth wireless protocols.

I/O devices 118 may include one or more components configured to communicate information with a component or user associated. I/O devices 118 may include a console with an integrated keyboard and mouse to allow user input. According to one embodiment, I/O devices 118 may be configured to receive one or more requests to stream data between a transmitter and a receiver. For example, the receiver 104 may be a personal computer or a smart phone, and I/O device 118 may be a touch screen that allows a user to request a webpage over network 120 from transmitter 102. The webpage may be provided in an encoded format, which receiver 104 may decode for display to a user on a display, which may also be an I/O device 118. I/O devices 118 may also include peripheral devices such as, for example, a printer, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Figure 2:
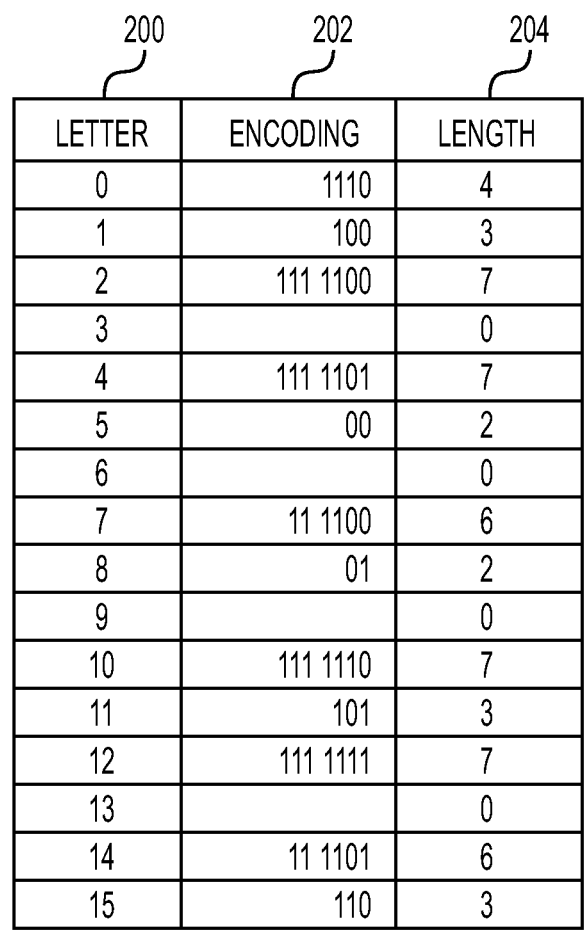
FIG. 2 is an exemplary encoding table.

Turning to FIG. 2, an example of canonical Huffman encoding will be provided in more detail. Transmitter 102 may employ a version of this encoding or any other type of encoding for data storage or transmission. Assume a set of data will be compressed with a Huffman code and that, in this example, the letters of the code alphabet includes the numbers zero through fifteen. The size of the alphabet may be any number and sixteen is chosen merely for illustrative purposes. GZIP, for example, includes two hundred and fifty-five literal codes, followed by a stop code, and then codes two hundred and fifty-seven through two hundred and eighty-five indicate the length of a matched range.

The letters in the alphabet for this example are shown at 200 in FIG. 2, and include the numbers zero through fifteen. These letters may be encoded as shown in column 202 based on the frequency of usage in a data stream to be transmitted. The encoding scheme sorts the letters in the alphabet based on their frequency of usage. Letters that are use the most often are encoded with the least number of bits starting at 00. In the example of FIG. 2, it can be see that letter "5" occurs most often in the bit stream to be sent, so "5" is encoded with the fewest number of bits to be used, which is two bits in this example. As a result, "5" may be encoded with "00". The corresponding length of the encoding "00" is two, as shown in the length column 204. The next most frequently occurring letter is the number 8. The encoding increases by one, making the encoding for the next most frequently occurring letter 8 have a value of "01", which also has a length of two. The encoding scheme may attempt to group the frequencies of occurrences for each letter with the least number of bits to minimize data transmissions. The letter that occurs most frequently may not receive the first encoding value, but it may be encoded with the fewest number of bits. For example, the number "8" may be encoded with "00" and the number "5" may be encoded "01". In this example, the two most frequently occurring letters are still encoded with the fewest number of bits. If two letters occur most frequently in the bit stream to be sent, the letter that occurs first naturally, 5 in this example, may be encoded with "00" before encoding the latter number, such as 8 in this example.

A left shift may occur when the width of the encoding value increases. Continuing with this example, the encoding value increases by one and is shifted left, so "01" becomes "100," which has a length of three. This encoding value is assigned to the letter "1" since it is the next most frequently occurring letter. This process repeats itself to create the encoded bit stream. Assigning shorter encoding values and lengths to more frequently used letters reduces the amount of transmitted data because the letters may be represented by transmitting the lengths, as described below. While the width has increased by one in this example, the width may increase by more than one. For example, the next encoding value in this example may be 1000, having a width of four, instead of 100.

Because the alphabet may be sorted in order of letters zero through fifteen, the canonical values can be rebuilt by transmitting, in order, the lengths of each corresponding letter. The transmitted lengths can therefore be used to create a codebook by the receiver. The receiver may refer to this codebook as it receives a bit stream and use it to decode the incoming bit stream.

Continuing with the example in FIG. 2, the lengths may be sent in order moving down column 204 by transmitting 4, 3, 7, 0, 7, 2, 0, 6, 2, 0, 7, 3, 7, 0, 6, and 3. Depending on the bit stream to be encoded, some letters may not be used, and therefore do not receive an encoding. As illustrated, unused letters may be assigned a length of zero to indicate that the letter is not used in the bit stream.

Having received the ordered lengths, the receiver may rebuild the codebook by correlating the received lengths with the corresponding encoding and letter. The rebuilt values, which may be, in one example, canonical Huffman code values, may be placed in memory, such as a TCAM, and later used for decoding a bit stream. The TCAM may use the canonical Huffman values and lengths to determine the letter presented in an incoming compressed data stream once it has been programmed.

Figure 3:
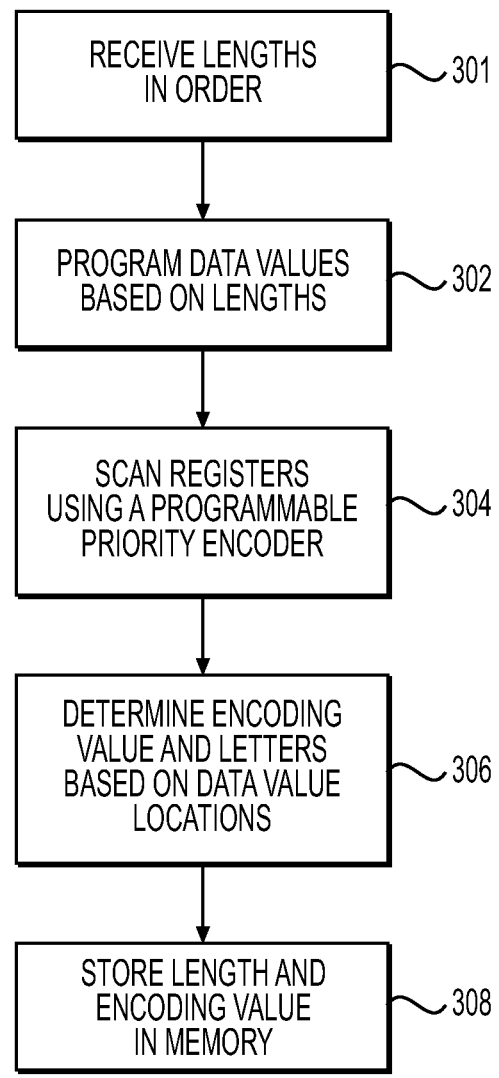
FIG. 3 is an exemplary flow diagram for building a decoding table.

FIG. 3 illustrates an exemplary flowchart for using a programmable priority encoder to rebuild canonical Huffman coding values in a TCAM. At step 301, the receiver may receive lengths associated with the encoding scheme in order, as described previously. Next, at step 302, the receiver may program data values into the registers based on the order in which the lengths were received. In one exemplary embodiment, the lengths themselves may not be transmitted in a natural number format. For example, in a GZIP block header, the lengths may be sent using compressed encoding as discussed in RFC-1951. Implementation using RFC-1951 and other compression techniques therefore should be considered part of the disclosure, with transmission of non-encoded lengths being an exemplary embodiment. When encoded lengths are used, the lengths may be decoded and then transferred into the registers.

In the example of canonical Huffman coding, the Huffman code may be rebuilt by sending the length which represents the number of bits in each code. The length may, in this example, be fifteen or less. There may be, in an exemplary embodiment, one register for each length received. Accordingly, fifteen registers may be associated with the lengths in this example. FIG. 4A illustrates an example of seven exemplary registers out of fifteen that may be used. Fewer or additional registers, such as fifteen in the example of canonical Huffman coding, may be used depending on the encoding format being used.

As illustrated in FIG. 4A, the registers 402 may all first be cleared by setting the stored data values in each position 404 to zero. In this example, the first length received may be a length of four, as illustrated in FIG. 2. Because the lengths may be sent in order of the represented letters, the receiver can correlate the length of four with letter zero. Accordingly, the first length received may be four, which may be associated with letter zero. A data value of one is programmed into register 402 number four at position 404 zero to indicate that the length of four is associated with letter zero, as shown in FIG. 4A. This indicates that the letter zero will be represented by transmitting a code having a length of four in an encoded bitstream.

This process continues by transferring the lengths, in order respective to their associated letters, to the receiver. Returning to FIG. 2, the next length that will be sent in this example is 3, followed by 7, 0, 7, and so on. Accordingly, as shown in FIG. 4B, the next register 402 programmed will be register number three. Because the first length that was sent was associated with the letter zero, the second length sent will be associated with the next letter in the alphabet, in this example, one. Accordingly, the length of three will cause register number three to be programmed with a data value of 1 at a location corresponding to the respective letter one, as shown in FIG. 4B. Although the registers 402 are illustrated as being programmed with a data value of 1 to correlate the lengths to the respective letters, the registers may also all be initialized to 1 and programmed with a 0. Other techniques may also be used to program a register associated with a length to the respective letter in the alphabet.

Figure 4C:
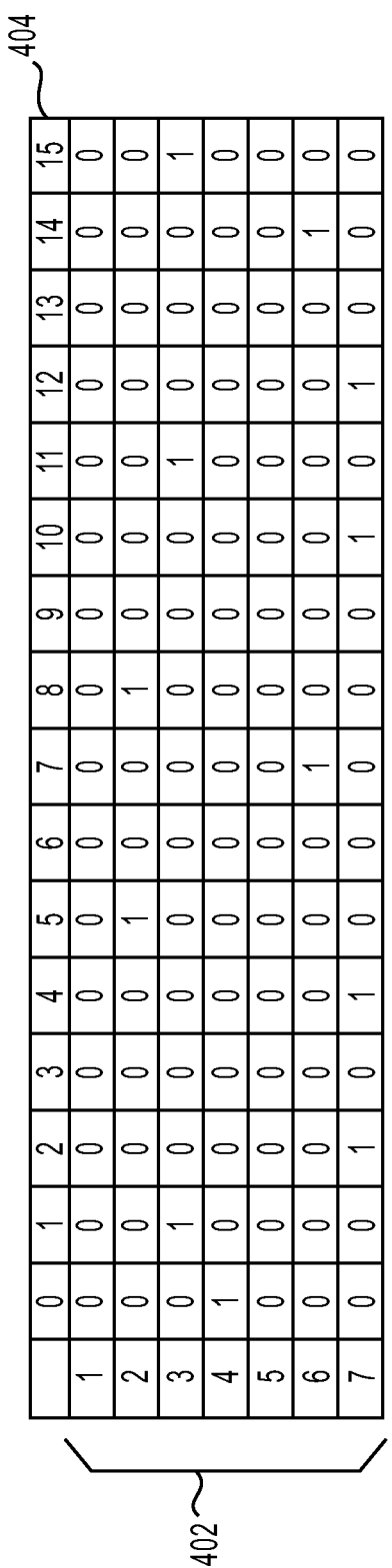

Step 302 in FIG. 3 repeats until the registers have been programmed at the appropriate positions based on the received, ordered lengths. The result is shown in FIG. 4C, where seven exemplary registers have been programmed. It will be appreciated that the alphabet may be any combination of letters, numbers, or symbols, in any order, so long as the transmitter and receiver both know the alphabet and its order. Different encoding schemes may use different alphabets with different orders, any of which may be used consistent with the disclosed embodiments.

Next, at step 304 in FIG. 3, the registers may be scanned using a programmable priority encoder to locate the data values. Traditional priority encoders use a fixed priority order to examine signals received at input ports and identify the highest priority port on which a signal is asserted. A programmable priority encoder may use a variable starting position that is received as a logic parameter and generate the address of the first port at or after the starting position that contains an asserted signal or data value.

Step 304 may locate the positions of the data values within a register, which is in this example position 1. Locating the positions of data values allows the canonical Huffman decoding table to be rebuilt. The process of scanning the registers will be described in more detail with reference to FIG. 6 below.

Figure 5A:
FIGS. 5A-B illustrate exemplary decoding tables being recreated.

At step 306, the encoding value and associated letters may be determined based on a position of the data values in the one or more registers. A table may be created in memory as shown in FIG. 5A. As illustrated, the letters 200 and their ordering are already known by the receiver. The respective encoding values 202 may initially be cleared, along with the lengths 204 being set to zero. As the registers are scanned, the data values programmed into the registers may be located and used to determine the encoding values and associated letters.

For example, in FIG. 4C, it can be seen that scanning register 402 number one will not locate any set data values. The values in register 402 number one are set to zero, in this example. Next, register 402 number two may be scanned. Scanning register number two locates a data value of one set at position number five. This means letter number five has a length of two, as shown in FIG. 5A. Continuing to scan registers 402 will locate the next data value set at position eight in register 402 number two.

The encoding values may be determined in a variety of manners depending on the encoding technique. In the example of canonical Huffman encoding, the first located data value may begin with all zeros for the indicated length. Because, in one exemplary embodiment, each register may be associated with a length, scanning register number two indicates that the length of the encoding value will likewise be two. When a data value is located at position five in register two, the length of two will be correlated with letter five. The respective encoding value will also have a length of two bits. Encoding values may begin with all zeros and increment. When the bit length increases, for example, from two to three, the new encoding value may be determined by incrementing by one and then appending a zero in a left-shift fashion.

Figure 5B:

For example, as shown in FIG. 5A, the first encoding value for letter five having a length of two will be set as 00. The next data value in this example may be found at position eight of register two, also indicating an encoding length of two. The next encoding value may therefore be assigned, in this example, 01, by incrementing one. The remainder of register 402 number two will be scanned without locating any additional data values. Then, as illustrated in FIG. 4C, register 402 number three will be scanned and a data value is found at position 1. This indicates that the next data value in the alphabet has a length of three. The encoding value will therefore be the last encoding value of 01, incremented by one, and having an appended zero. As illustrated in FIG. 5B, the encoding value located in register number three therefore has a length of three, an encoding value of 100, and corresponds to letter 1. Step 304 may repeat to determine the encoding values and letters based on the data value locations for the remaining by searching register positions.

Returning to FIG. 3, the encoding values and lengths may be stored in memory at step 308. The table may be programmed sequentially so that steps 304, 306, and 308 may repeat by scanning a register to locate a data value, determining the encoding value and associated letter for a data value, and storing the length and encoding value in memory. In another exemplary embodiment, the encoding value and associated letters may be determined at step 306 for all of the registers, and then stored in memory at step 308. It will be appreciated that the steps in FIG. 3 may be performed in varying orders so as to receive lengths and use the received lengths to store a decoding table in memory. The process described above therefore results in the table of FIG. 2, located on the transmitter side, being recreated and stored in memory by the receiver by transmitting only the lengths. In one exemplary embodiment, the memory may be a ternary content-addressable memory (TCAM).

Figure 6:
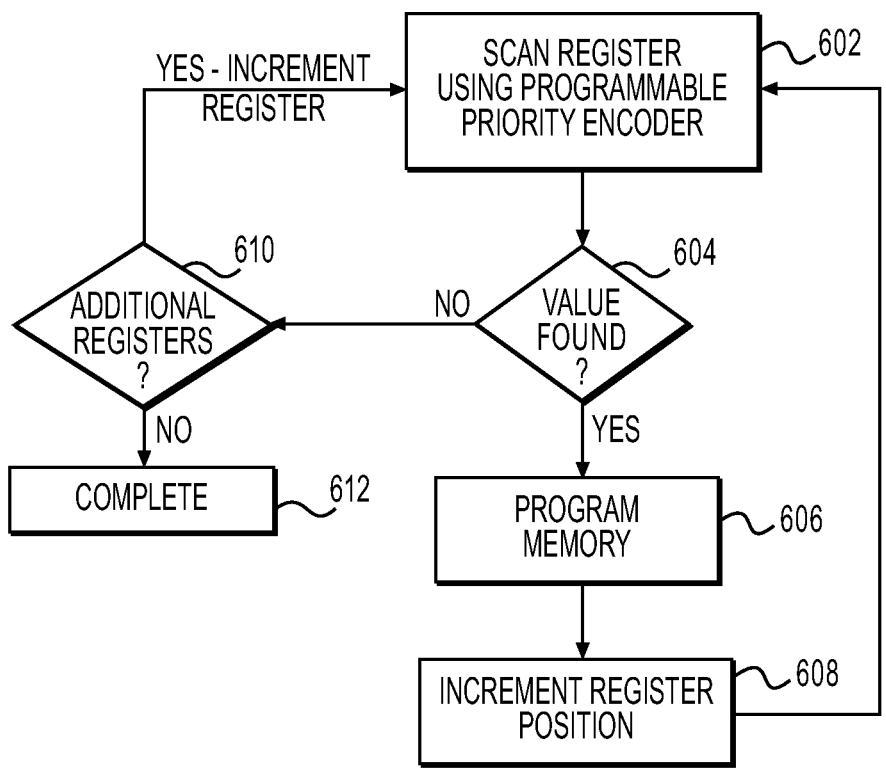
FIG. 6 illustrates an exemplary flow diagram for scanning registers to build a decoding table.

The process of scanning the registers using a programmable priority encoder and storing the encoding values and lengths will now be described in more detail with reference to FIG. 6. At step 602, a programmable priority encoder may scan the registers, for example, in order. In the example of canonical Huffman encoding which may use fifteen registers based on up to fifteen lengths of encoded values for letters, the programmable priority encoder may scan register number one and sequentially scan additional registers through register number fifteen.

The programmable priority encoder may begin scanning at a location defined by the starting position. Initially, the starting position may be zero and the positions within each register may, in one example, be scanned in increasing order. The starting position may be incremented to the position at which a data value is found, or the next position, as described in more detail below.

Although the examples previously described employ registers with fifteen bits, the number of bits may increase to accommodate the length of an alphabet in the particular encoding scheme. Further, while one register corresponds to each length, it will be appreciated that two or more registers may be employed for each length, allowing the alphabet to be stored across two or more registers by employing additional logic to track the registers associated with each length.

As a register is scanned, the programmable priority encoder may determine whether a set data value has been found at step 604. Once a data value has been found, the programmable priority encoder may return the address at which the data value has been located, allowing the length, encoding value, and letter to be associated and programmed into memory at step 606, as previously described with reference to FIG. 3. Next, at step 608, the register position may be incremented and scanning may resume at step 602, using the next address as the starting position for scanning the programmable priority encoder.

If, however, a data value is not found in a register at step 604, the process may determine whether there are any additional registers to scan at step 610. If not, then all registers have been scanned, all data values have been located, and the process completes at step 612. In one embodiment, all registers need not be scanned. When lengths are programmed into the registers initially, any register that did not get programmed may be marked with, for example, a dirty bit. This may indicate that the register does not store any data value and need not be scanned. An example of this is shown in register 402 number one in FIG. 4C. When additional registers remain to be searched, the register may be incremented and the next register may be scanned at step 602.

An example of the process in FIG. 6 will be described with reference to FIG. 4C. At step 602, the first register 402 number one may be scanned. No data value has been set to 1 in register 402 number one, so at step 604 the process will continue and determine that there are additional registers to be scanned at step 610. Alternatively, register 402 number one in this example need not be scanned if a bit has been set indicating it does not store any data values. The register number may be incremented, and register 402 number two will be scanned at step 602.

A data value will be found at step 604 in position five of register 402 number two. Because this data value was in register number two, it has an encoding length of two bits. The first encoding value begins at 00, in this example. Because the data value was in position five, the correspond letter in the alphabet is the fifth letter, in this example, five. Therefore, as shown in FIG. 5A, the entries associated with letter number five will be programmed with an encoding value of 00 and a length of two at step 606. The register position may then be incremented at step 608. The position in which the previous data value was located was position five, so position six may be returned to the programmable priority encoder at step 602. By beginning the next search of register two at position six, the programmable priority encoder locates values in fewer clock cycles and speeds up system operation.

Searching will then continue in register 402 number two from position six. Another data value is located at step 604 in register 402 number two at position eight. Accordingly, the memory may be programmed at step 606 with a two for the length and 01 for the encoding value of letter eight, as shown in FIG. 5A.

The register position will then increment at step 608, and searching in register number two will resume from position eight at step 602. No value is found in the remainder of register number two at step 604, but additional registers do exist at step 610. Therefore, the register to be searched will be incremented to register number three, and scanning may resume from position one in register number three at step 602. A data value may be located at step 604 in position two, and the associated entry for the second letter, in this example, one, will be programmed at step 606 with a length of three and an incremented and left-shifted encoding value of 100, as illustrated in FIG. 5B. The register position may increment, and searching may resume from position three in register number three. This process completes itself until complete, allowing the table in FIG. 2 to be recreated in a TCAM by the receiver.

The above description has been made with specific reference to an exemplary encoding scheme with fifteen letters 200, encoding values 202, and lengths. This description has been exemplary as the methods for creating a decoding table have application to a variety of applications, including different encoding schemes, different exemplary letters (such as the ASCII characters), different encoding values, and different lengths. It will be appreciated that, for example, encoding values may begin at values other than 00, the lengths may include lengths beginning at numbers other than two and increasing to accommodate various alphabets, and more or fewer registers with more or fewer positions may be utilized.

Figure 7:
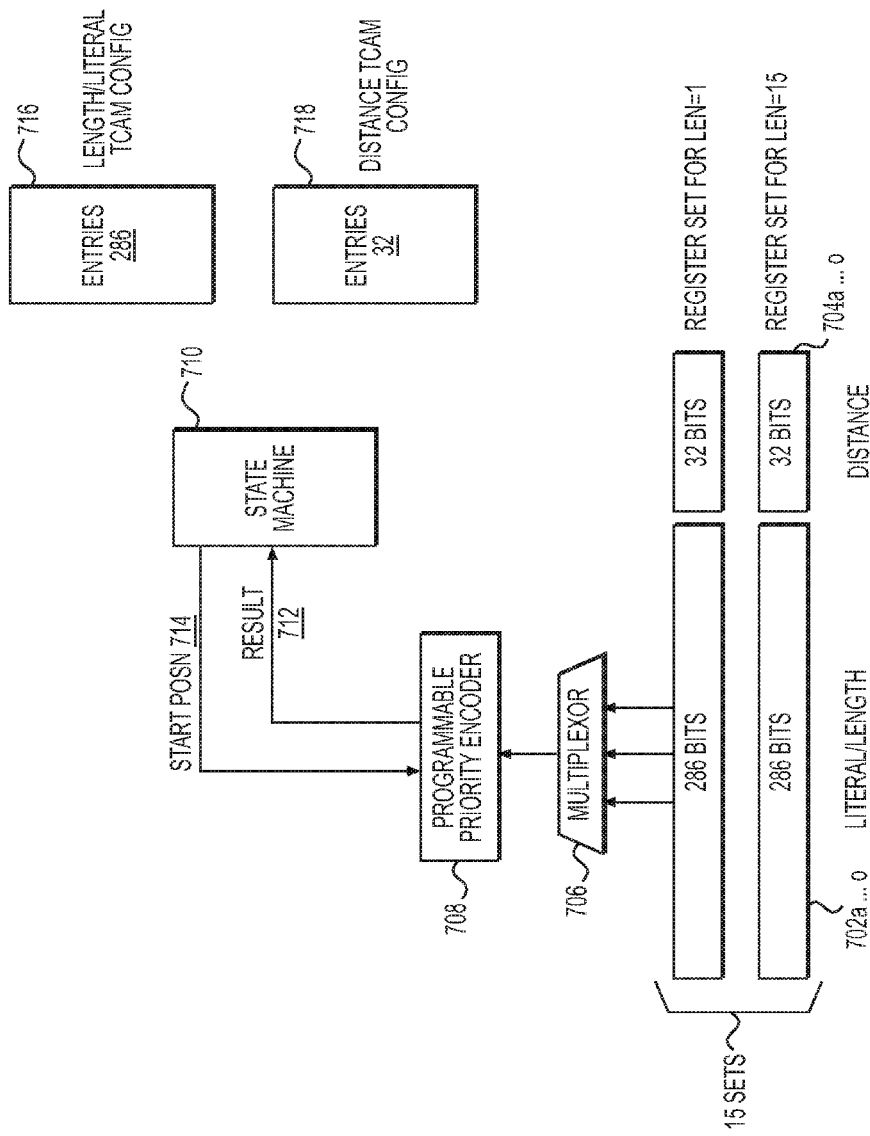
FIG. 7 illustrates an exemplary system for building a decoding table.

FIG. 7 illustrates an exemplary system diagram for building a decoding table. The system may include a plurality of registers 702*a* . . . *o*. In this example, fifteen sets of registers 702*a* . . . *o* may exist for canonical Huffman encoding, which allows encoding values having lengths up to fifteen. The register sets may store 286 bits in registers 702*a* . . . *o* plus an additional 32 bits for a distance in registers 704*a* . . . *o*. Although illustrated as two separate registers 702*a* . . . *o* and 704*a* . . . *o*, it will be appreciated that the literal/length bits and the distance bits may be stored in a single register.

The registers 702*a* . . . *o* and 704*a* . . . *o* may be connected to a programmable priority encoder 708 using, for example, multiplexor 706. The programmable priority encoder 708 may scan the registers as described previously to locate data values that were set in the appropriate positions as the lengths were received. Programmable priority encoder 708 may output the location at which it finds a data value at 712 to a state machine 710. State machine 710 may track the position at which a data value has been found, increment that position, and provide it back to the programmable priority encoder 708 as the starting position 714 for the next search. State machine 710 may be part of programmable priority encoder 708 or separate.

The initial start position may be for register number one at position number zero or one. If a data value has been found in register number two at position number five, for example, programmable priority encoder 708 may output five to state machine 710. State machine 710 will increment this value and indicate to the programmable priority encoder 708 that the next start position will begin at six, as previously described. A CPU, such as the one illustrated in FIG. 1, may handle programming the memory tables 716, 718 as data values are located. Alternatively or additionally, the state machine 710 may program memory tables 716, 718.

The prior description related to recreating a decoding table in memory 716, such as TCAM memory, for an exemplary embodiment of length values. The length values may be used to create a decoding table for the alphabet and letters. Out of the exemplary 286 bits for the length registers, some may not be alphabet characters. For example, bits 0-255 may be ASCII letters and additional bits may indicate how many bits that were previously sent to copy and indicate the end of a block.

The distance bits in registers 704*a* . . . *o* may undergo a similar process to create a distance decoding table 718. In one exemplary embodiment, distances may allow the transmitter to indicate which bits are repeating in a bit stream. When bits repeat in a bit stream, further compression may be obtained by sending an indication to copy previously sent bits rather than retransmitting the bits. In one example, the number of bits that repeated may be located in bits 256-285 of the length values. The distance value may indicate, for example, the distance to go back in a bit stream before finding the bits that repeat. Lengths and distances are just two examples that are not limiting. In addition, the distances may refer to bytes rather than bits. Other compression schemes may be employed that may use different decoding tables and procedures consistent with the described embodiments. In one example, GZIP schemes and RFC-1951 may be used.

Once the decoding tables have been created, an incoming bit stream may be decompressed for use. For example, a webpage may be sent using canonical Huffman encoding and GZIP compression, and that bit stream may be decompressed. The process of transmitting lengths and creating decoding tables described herein may repeat at intervals defined by the transmitting or encoding side. In one example, an image and text within a webpage may receive better compression by employing two separate compression algorithms for each. In this example, the processes described herein may execute twice, allowing separate decoding tables to be created for each compressed bit stream corresponding to the image and the text. This is just one example, as the compressing side may employ a variety of algorithms for data compression. The end of a compressed data stream and beginning of a new compression scheme may be marked by, for example, a stop bit.

The systems and methods described herein may be used in a variety of applications. In addition to compressing data sent between a transmitter and a receiver over a network, the systems and methods for building a decoding table in a TCAM using a programmable priority encoder may be used within a single system. Any physical media, such as a disk, memory, tape drive, and the like may use data compression to reduce the amount of storage needed. In addition, TCAM memory may be used in variety of applications for pattern recognition and other data processing that may employ the techniques described herein.

Moreover, while a single TCAM has been described along with a TCAM including two tables, it will be appreciated that any number of TCAMs may be provided within a system. The TCAM tables may be programmed for different purposes, encoding schemes, and other purposes depending on the compression algorithms employed. Systems may include, for example, multiple TCAMs with populated tables to decompress multiple incoming streams simultaneously.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, for example, through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

While this specification contains many specific implementation details, these should not be construed as limitations on the claims. Certain features that are described in this specification in the context of separate implementations may also be implemented in combination in a single implementation. Conversely, various features that are described in the context of a single implementation may also be implemented in multiple implementations separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

It should be appreciated that the logical operations described herein with respect to the various figures may be implemented (1) as a sequence of computer implemented acts or program modules (i.e., software) running on a computing device, (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

The invention claimed is:

1. A system configured to use a priority encoder to create a decoding table in one or more ternary content-addressable memory for decoding of one or more encoded bit streams, the system comprising:
   a receiver comprising i) one or more ternary content addressable memory configured to store one or more decoding tables associated with variable bit-length decoding of literal or distance symbols in one or more encoded bit streams, wherein the one or more decoding tables comprise a plurality of encoded bit patterns for variable bit length decoding of the literal or distance symbols, and ii) one or more circuits, coupled to the one or more ternary content addressable memory, to build the decoding tables from a codebook bit stream comprising a plurality of length parameters, the one or more circuits comprising:
   a plurality of registers configured to receive the codebook bit stream comprising the plurality of length parameters,
      wherein each register of the plurality of registers has a register number that is associated with a bit length value for a given encoded bit pattern to be used in the decoding table for decoding a given literal or distance symbol, and
      wherein each register has a plurality of bit positions, wherein each bit position is associated with the given literal or distance symbol such that an encoding data bit value intersected between a given bit position of the plurality of bit positions and a given register number of the plurality of registers define a bit length value for the given literal or distance symbol; and
   a priority encoder operatively coupled to the plurality of registers, the priority encoder being configured to simultaneously scan one or more of the plurality of registers, wherein each scan determines, for a given register, presence of one or more encoding data bit values at one or more bit positions of the plurality of bit positions, wherein each determined bit position and corresponding determined register number is maps to a corresponding bit pattern defined in the priority encoder to generate the given encoded bit pattern, wherein the given encoded bit pattern populates the decoding table for the variable bit-length decoding of the given literal or distance symbols in the one or more encoded bit streams.

2. The system of claim 1, wherein the variable bit length decoding is selected from the group of consisting of Huffman encoding, canonical Huffman encoding, an encoding in a GZIP file format, and a combination thereof.

3. The system of claim 1, wherein the priority encoder is coupled to a state machine configured to provide a starting position for the each scan.

4. The system of claim 3, wherein the priority encoder comprises a programmable priority encoder, the programmable priority encoder being configured to:

identify a starting register of the of the plurality of
registers, the starting register having a register value
associated with or derived from a starting position;
increment a scan starting position to a position at the
starting register; and
scan the one or more registers from the scan starting
position.

5. The system of claim 3, wherein the priority encoder scans only the plurality of registers that are known to store the encoding data bit values.

6. The system of claim 1, the plurality of received length parameters are used to build the decoding tables to be used in a deep packet inspection operation of an incoming data stream received from a network connection of the system.

7. The system of claim 1, comprising:
a processor; and
a computer readable medium having instructions stored therein, wherein the instructions when executed by the processor, cause the processor to decode the one or more encoded bit steams using the decoding table in the one or more ternary content addressable memory.

8. A method for building a decoding table in one or more ternary content-addressable memory for variable-bit length decoding of one or more encoded bit streams, the method comprising:
receiving, at a plurality of registers, a data stream having a plurality of bits, wherein each bit of the plurality of bits having an encoding data value is associated with a length parameter for an encoded bit pattern, to be used in a decoding table, for variable bit length decoding of literal or distance symbols in one or more encoded bit streams, wherein each register of the plurality of registers has a register number associated with a bit length value for the encoded bit pattern to be used in the decoding table for decoding a given literal or distance symbol, and wherein each register has a plurality of bit positions, wherein each bit position is associated with the given literal or distance symbol such that an encoding data bit value intersected between a given bit position of the plurality of bit positions and a given register number of the plurality of registers define a bit length value for the given literal or distance symbol;
scanning one or more of the plurality of registers, wherein each scan simultaneously determines, for a given register, presence of one or more encoding data bit values at one or more bit positions of the plurality of bit positions, wherein each determined bit position and corresponding determined register number maps to a corresponding bit pattern defined in the programmable priority encoder to generate a given encoded bit pattern, wherein the given encoded bit pattern populates the decoding table for the coding of the given literal or distance symbol;
determining, via a programmable priority encoder, based on each determined one or more bit positions and corresponding determined register number of the scanned one or more registers, the given encoded bit pattern, to be used in the decoding table, for the variable-bit length decoding of the given literal or distance symbol; and
storing, in one or more ternary content-addressable memory, the given encoded bit pattern and an association between the given encoded bit pattern and the given literal or distance symbol, wherein the one or more ternary content-addressable memory for variable-bit length decoding of one or more encoded bit streams.

9. The method of claim 8, wherein the variable-bit length decoding is selected from the group of consisting of Huffman encoding, canonical Huffman encoding, an encoding in a GZIP file format, and a combination thereof.

10. The method of claim 8, wherein scanning the one or more registers further comprises:
determining a starting register among the plurality of registers position at which to perform the scanning;
identifying a location of a first data value within one of the registers, the location being at or after a starting position;
incrementing the starting position to be a position at or after the location of the first data value; and
using the incremented starting position to scan for the data value in a second location.

11. The method of claim 8, comprising:
decoding the one or more encoded bit streams using the decoded table in the one or more ternary content-addressable memory.

12. An apparatus comprising:
a first means to receive a data stream having a plurality of bits, wherein each bit of the plurality of bits having an encoding data value is associated with a length parameter for an encoded bit pattern, to be used in a decoding table, for variable bit length decoding of literal or distance symbols in one or more encoded bit streams, wherein each of the first means has an associated number associated with a bit length value for the encoded bit pattern to be used in the decoding table for decoding a given literal or distance symbol, and wherein each of the first means has a plurality of bit positions, wherein each bit position is associated with the given literal or distance symbol such that an encoding data bit value intersected between a given bit position of the plurality of bit positions and a given register number of the plurality of registers define a bit length value for the given literal or distance symbol;
a second means to scan one or more of the first means, wherein each scan simultaneously determines presence of one or more encoding bit values at one or more bit positions of a portion of the first means, each determined bit position and associated number maps to a corresponding bit pattern defined in the programmable priority encoder to generate the given encoded bit pattern, wherein the given encoded bit pattern populates the decoding table for coding of the given literal or distance symbol; and
a third means i) to determine, based on the determined one or more bit positions and the determined associated number, a given encoded bit pattern to be used in the decoding table, the given encoded bit pattern being associated with a given literal or distance symbol and ii) to store, in a fourth means, the given encoded bit pattern and an association between the given encoded bit pattern and the given literal or distance symbol, wherein the fourth means is used to variable-bit length decode the one or more encoded bit streams.

13. The apparatus of claim 12, wherein the fourth means comprises ternary content-addressable memory, and wherein the variable length decoding codebook is selected from the group consisting of canonical Huffman encoding, Huffman encoding, an encoding in a GZIP file format, and a combination thereof.

14. The apparatus of claim 12, comprising
a means to receive a starting register among the plurality of registers at which to perform the scan;

a means to identify a starting register having a register value associated with or derived from a starting position;

a means to increment a scan starting position to a position at the starting register; and a means to scan the first means from the scan starting position.

15. The apparatus of claim 12, comprising means to identify which portion of the first means includes encoding data therein, wherein only the identified portion of the first means is scanned by the second means.

16. The apparatus of claim 12, comprising means to decode an incoming bit stream using the fourth means.

17. The system of claim 1, wherein the codebook bit stream is received from a computer readable medium prior to a boot up sequence for the system, wherein the computer readable medium comprises a system image file associated with the boot up sequence of the system, and wherein the codebook bit stream is used to build the decoding table to be used to decode the system image file to be used in the boot sequence of the system.

18. The system of claim 1, wherein the codebook bit stream is received from a block header of a compressed GZIP format file.

19. The method of claim 8, wherein the codebook bit stream is received from a computer readable medium prior to a boot up sequence for a computing device, wherein the computer readable medium comprises a system image file associated with the boot up sequence of the computing device, and wherein the codebook bit stream is used to build the decoding table to be used to decode the system image file to be used in the boot sequence of the computing device.

20. The method of claim 8, wherein the codebook bit stream is received from a block header of a compressed GZIP format file.

* * * * *